United States Patent [19]

Curtis et al.

[11] Patent Number: 5,003,556
[45] Date of Patent: Mar. 26, 1991

[54] SQUELCH CIRCUIT

[75] Inventors: Robert A. Curtis, Hudson, Mass.; William C. Mallard, Jr., Nashua, N.H.

[73] Assignee: Digital Equipment Corporation, Maynard, Mass.

[21] Appl. No.: 375,036

[22] Filed: Jun. 30, 1989

[51] Int. Cl.⁵ .............................................. H04B 1/10
[52] U.S. Cl. .................................... 375/104; 455/218; 328/118
[58] Field of Search .................... 375/94, 106, 76, 104; 455/223, 218, 22 X, 303, 304; 307/358; 328/108, 109

[56] References Cited

U.S. PATENT DOCUMENTS

| | | | |
|---|---|---|---|
| 2,235,804 | 3/1941 | Macalpine | 177/353 |
| 3,521,172 | 7/1970 | Harmon | 328/133 |
| 3,780,727 | 12/1973 | King | 128/2.05 R |
| 3,889,197 | 6/1975 | Duff | 328/55 |
| 4,038,605 | 7/1977 | Elder et al. | 375/104 |
| 4,086,430 | 4/1978 | Brown | 375/104 |
| 4,479,252 | 10/1984 | Souchay et al. | 455/223 |
| 4,575,683 | 3/1986 | Roberts et al. | 375/76 |
| 4,617,677 | 10/1986 | Chiba | 375/104 |
| 4,815,108 | 3/1989 | Oda | 375/104 |
| 4,827,514 | 5/1989 | Ziolko | 375/113 |

Primary Examiner—Benedict V. Safourek
Assistant Examiner—Stephen Chin
Attorney, Agent, or Firm—Neuman, Williams, Anderson & Olson

[57] ABSTRACT

A squelch circuit is disclosed that distinguishes between noise impulses and valid packets of data transmitted over a transmission line such as a twisted pair media within a local area network. The squelch circuit converts supplied data into a stream of positive and negative pulses and detects a sequence of positive and negative pulses quantified in time based on prior knowledge of the characteristics of a valid packet of data and permits the supplied data to pass if it has the characteristics of a valid packet of data or prohibits the supplied data from passing if it does not have the characteristics of a valid packet of data.

40 Claims, 3 Drawing Sheets

SQUELCH CIRCUIT

The invention relates to a squelch circuit and more particularly to a squelch circuit for discriminating valid signal activity from burst noise signals transmitted over a transmission line, in particular twisted pair media. The invention operates reliably at high speeds and is relatively simple in construction and operation.

BACKGROUND OF THE INVENTION

A typical local area network (LAN) provides a communication facility for data exchange among devices located within a moderate sized geographical area. Such a network may include a number of workstations and other LAN compatible devices arranged in the proximity of each other for use in office automation, distributed data processing and other situations requiring connection to a local communication medium. It is desired that the network operate in an economical fashion with the ability for carrying bursty traffic at high peak data rates. The Ethernet TM is an example of such a network.

Pursuant to the 10 BASET standard soon to be promulgated by the Institute of Electrical and Electronic Engineers (IEEE), transmission of Ethernet TM data may occur over a twisted pair media as well as coaxial cable. This standard requires workstations or other devices to be placed in a star configuration in a point to point arrangement about a repeater, a device used to extend the length and topology of the Ethernet TM. The physical configuration envisions the bundling of telephone lines with the Ethernet TM twisted pair bundles or in close proximity to the twisted pair bundles.

In this arrangement, disturbances to the local area network effect the performance of the network. These disturbances may result from noise impulses caused by telephone operation on adjacent wiring In particular, if a telephone rings or the hand set is picked up, a signal induced by cross-talk coupling appears as a damped sinusoidal waveform on the twisted pair media. In a busy office, such noise impulses frequently cause the start of an Ethernet TM packet frame, and cause the transmission of packet fragments generated by the repeater to the entire network.

Another frequent disturbance on the network is caused by a condition known in the art as self cross-talk. The transceiver or Media Access Unit (MAU) of one workstation may, for example, transmit data to the repeater with the same data retransmitted to all of the other segments attached to the repeater. Adjacent transmit pairs may couple and provide a crosstalk signal to the receiving pairs of the repeater. The repeater may thereby interpret the crosstalk signal as a valid packet of data and provide the network with false collision activity.

These disturbances create extra traffic on the network, and will create collisions on real packets of data, resulting in reduced bandwidth on the entire network and to all of the attached nodes to the network. Further, when one workstation appears to be transmitting data, the system provides a wait or deference interval to other workstations attempting to transmit data until the first is finished with the transmission. Thus, the erroneous reception of a transmit signal significantly decreases throughput of the system by increasing the deference interval.

Prior art types of squelch circuits for local area networks commonly operate by detecting energy levels of the incoming data signal. Other types of squelch circuits operate by detecting discreet signal transitions in a known sequence from prior knowledge of the preamble of the packet of data. Such systems, however, are unreliable in discriminating crosstalk noise from a valid packet preamble.

SUMMARY OF THE INVENTION

The present invention provides a squelch circuit that discriminates real data packet traffic from burst noise transmitted over a transmission line such as twisted pair media in a local area network. The squelch circuit receives data transmitted over the network and detects a predetermined sequence of pulses characteristic of the preamble of the packet of data. The squelch circuit first converts the received data signals into a stream of positive and negative pulses and detects the presence of valid positive pulses of at least a predetermined voltage level and having at least a predetermined duration. It then detects the presence of valid negative pulses of at least a predetermined voltage level and having at least a predetermined duration An enable signal is generated in response to the sequential sensing of the predetermined sequence of positive and negative pulses which are indicative of the presence of the preamble of a valid data stream. The enable signal is received by a gate to permit the passage of the transmitted data stream to other circuit elements of an attached node on the network such as a decoder and bus controller.

Desirably, the squelch circuit also detects the absence of both positive and negative pulses over a preselected duration and generates a disable signal to prevent passage of the transmission. A disable signal is also generated upon the detection of a positive pulse for too long a duration or upon the detection of a negative pulse for too long a duration to satisfy requirements of network.

DETAILED DESCRIPTION OF THE PREFERRED EMBODIMENT

According to the present invention, a squelch circuit distinguishes between burst noise and a valid data stream or packet data transmitted within a local area network. The squelch circuit detects a sequence of positive and negative pulses quantified in time within the interval of several bits of the packet preamble. This pulse qualification is based on the characteristics of the preamble and occurs in a sufficient time to meet the timing requirements of the data receiving system. The invention has a particular application for the detection of an encoded preamble such as the Manchester preamble of Ethernet TM data transmitted over twisted pair media, but could just as easily be used in connection with other electrically conducting transmission media. It has been found that the invention may also be used in connection with optical media or an unbalanced line such as coaxial cable when an appropriate DC offset voltage is applied. The invention may also be used at different data rates with appropriate modification.

Figure 1:
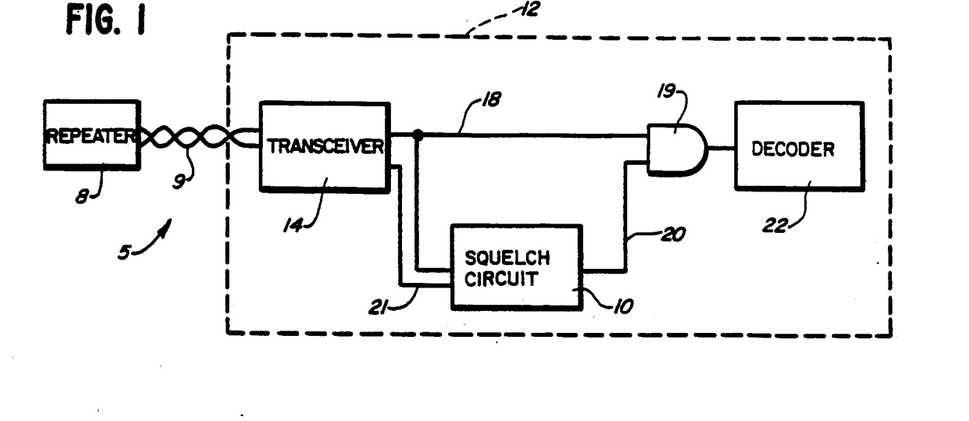
FIG. 1 is a block diagram representation of a squelch circuit according to the present invention placed within a transceiver of an attached node of a data processing network.

Turning now to the drawings, FIG. 1 depicts a simplified block diagram representation of an attached node such as workstation 12 linked in a local area network 5. The network 5 includes a repeater 8 having one of a number of ports interconnected with a transceiver unit 14 of the workstation 12 that communicates with other digital devices within the network over a data transmission line 9 such as twisted pair media. The repeater 8 supplies data to and receives data from workstation 12 as well as a number of other attached nodes (not shown) included in the network. As is common in the modern office space, the local area network is physically located in close proximity to telephone cables and other wiring.

The squelch circuit 10 is coupled to the output of the transceiver unit 14 via a line 18. Thus, the squelch circuit 10 receives a stream of data as received by the transceiver 14. An AND gate 19 receives this same stream of data as received by the transceiver 14. The AND gate 19 also receives the output generated by the squelch circuit 10 on a line 20, which corresponds to the detection of a valid or an invalid packet of data. The AND gate 19 logically ANDs the data stream on the line 18 with the squelch circuit output on line 20 and thereafter applies the resulting signal to a line driver or a decoder 22. The AND gate 19, or other such device, thereby provides an enabling function for the data stream from the transceiver 14. When an unsquelch signal or an output enable signal is present on line 20, the data stream is passed to the decoder 22. When a squelch signal or an output disable signal is present on line 20, the data stream is not passed. It should be understood that when reference is made to a squelch signal or a disable signal, this is intended to include the circumstance when no signal is present thereby preventing an AND gate 19 from passing the signal received from the transceiver 14. The decoder 22 performs timing synchronization functions to the received data stream as is well known in the art.

The squelch circuit 10 also receives a transmit active signal from transceiver 14 a via line 21 indicative of the transceiver 14 sending data from workstation 12. When transceiver 14 is not sending data, the network requires workstation 12 to begin timing operations to receive a data stream within no longer than the detection of the first few pulses of the preamble For one particular application, squelch circuit 10 must activate an output enable signal within five bit times and an output disable signal within less than three bit times. The network, however, requires longer data verification when transceiver 14 is sending data since the probability of noise detection is greater due to extraneous noise caused by cross talk paths. The squelch circuit 10 thereby performs an extended qualifying check on the incoming data stream with consideration of concurrent transmission by extending the bit sequence acceptance length.

It will be understood by those skilled in the art to which the invention pertains that transceiver unit 14 may include a transmission portion and receiving portion that, for example, pass data to an internal data multiplexer which thereafter provides the supplied data stream and the transmit data signal to squelch circuit 10 via line 18. It will also be understood that a pair of twisted leads interconnect the transmission portion and the receiver amplifier respectively to repeater 8.

Figure 2:
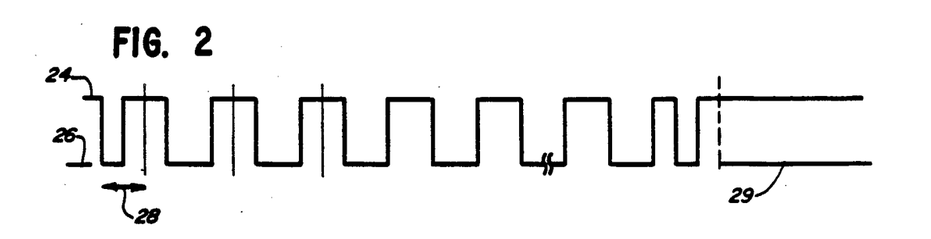
FIG. 2 is a timing diagram of the preamble of a data stream that provides the input signal for the squelch circuit of FIG. 1.

Turning now to FIG. 2, therein is shown a timing diagram for a preamble of a packet of Manchester coded Ethernet TM data, or a data stream transmitted on the local area network as a function of time. This represents a sample of the type of data stream supplied by the repeater 8 to the transceiver 14 in the workstation 12 of FIG. 1. Of course the preamble could be represented by any number of sequences and operate at any number of frequencies as will be known to those skilled in the art.

The preamble includes a high level denoted by the numeral 24 and a low level denoted by 26. The transitions of the bit pattern to the preamble occur at the center of a bit cell 28. Each bit cell preferably has a duration of 100 nanoseconds to provide a data rate of 10 megabits per second. At the beginning of the packet preamble, a low level voltage having a duration of 50 nanoseconds appears, followed by a high level voltage having a duration of 100 nanoseconds, followed by a low level voltage of 100 nanoseconds. This sequence of alternating 100 nanosecond high level and low level voltages continues to allow channel stabilization and synchronization. Of course, other sequences of high level voltages and low level voltages could be used to denote the preamble of a data stream. The packet of transmitted data denoted by the numeral 29 follows the preamble and may include destination information, source information and other coding along with the data as is well known in the art.

Figure 4:
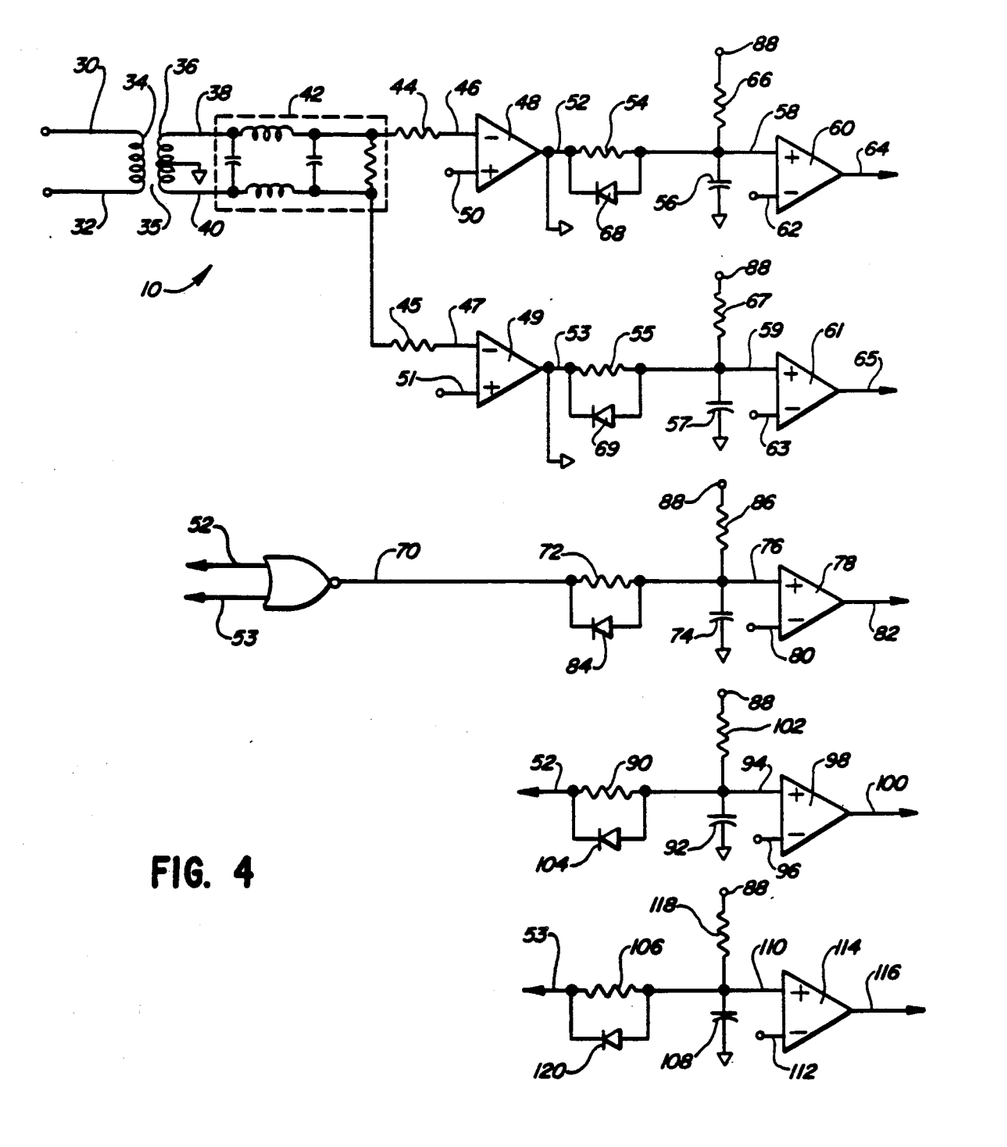
FIG. 4 is a simplified schematic diagram of the squelch circuit of FIG. 1 with much of the detail removed for clarity.

A schematic diagram of the analog portion of the squelch circuit 10 from FIG. 1 is shown in FIG. 4. The signal providing the data stream is transmitted over the local area network via twisted pair cable to a transcarrier, such as the transceiver 14 of FIG. 1, and coupled to the input terminals 30 and 32 of the primary winding 34 of a center-tapped transformer 35 located in the squelch circuit 10. The secondary winding 36 of transformer 35 has its center grounded to obtain a signal having positive and negative pulses of one half the amplitude of the preamble at the output terminal 38. Positive and negative pulses characteristic of the preamble are also generated at the output terminal 40 of secondary winding 36 of the same magnitude and 180 degrees out of phase with respect to the signal appearing at output terminal 38.

The signal generated at output terminal 38 of secondary winding 36 passes through a multiple-pole Butterworth lowpass filtering network shown as network 42 having a cutoff frequency of 15 MHz. The signal passes through a limiting resistor 44 and is applied to the inverting input terminal 46 of a first comparator 48. A negative threshold voltage, for example, minus 0.150 volts, is applied at the noninverting terminal 50 of comparator 48. When the magnitude of a negative pulse is greater than the threshold voltage, a signal at the output terminal 52 of the first comparator 48 will appear as a constant high voltage.

The signal appearing at the output terminal 52 of the first comparator 48 is thereafter applied to an integrating circuit including resistor 54 having its terminals connected between the output terminal 52 of the first comparator 48 and the noninverting input terminal 58 of a second comparator 60. A capacitor 56 is placed between the noninverting input terminal 58 of comparator 60 and ground. A reference threshold voltage is applied to the inverting input terminal 62 of comparator 60. The values of resistor 54, capacitor 56 and the reference voltage applied to the inverting input terminal 62 of comparator 60 are chosen so that the voltage applied to the noninverting input terminal 58 of comparator 60 exceeds the reference voltage for a signal having a duration greater than a predetermined time. It has been found that a duration of 25 nanoseconds is sufficient to detect a valid low voltage signal characteristic of the preamble of the data stream. The predetermined time, however, can be set to other values, such as a value between 20 nanoseconds and 35 nanoseconds in order to detect the initial low voltage value of the preamble shown in FIG. 2.

When the signal at input terminal 58 rises above the threshold voltage applied to input terminal 62 for the predetermined time, an output high voltage signal at line 64 appears corresponding to a negative pulse having a duration of at least 25 nanoseconds. The signal at line 64 will remain high as long as the signal applied to input terminal 58 is greater than the voltage applied to input terminal 62.

If the duration of a negative pulse, however, is less than a predetermined amount of time such as 25 nanoseconds the high voltage signal at output terminal 52 returns to a low voltage level. A diode 68 having its anode connected to the noninverting input terminal 58 of comparator 60 and its cathode connected to the output terminal 52 of comparator 48 causes capacitor 56 to rapidly discharge, thereby preventing the output signal at line 64 from indicating a high voltage. A resistor 66 having its terminals connected between the input terminal 58 of comparator 60 and a positive voltage 88 is preferably placed in the integrating circuit to maintain a forward bias across diode 68 and provide a known reset voltage at input terminal 58.

The circuit corresponding to the detection of a positive pulse operates in a similar fashion. The output terminal 40 of secondary winding 36 provides a signal of one half the amplitude and 180 degrees out of phase with respect to the preamble of the transmitted data stream and passes through the multiple-pole Butterworth filtering network 42. Thereafter, the signal is applied through a resistor 45 to the inverting input terminal 47 of a first comparator 49. A threshold voltage corresponding to the minimum required level for a valid positive pulse is applied to the noninverting input terminal 51 of comparator 49. Thus, when the magnitude of a positive pulse appearing at input terminal 47 is greater than the threshold voltage, a signal at the output terminal 53 of comparator 48 appears as a constant high voltage.

The output signal at terminal 53 is thereafter applied to an integrating circuit including a resistor 55 having its terminals connected to the output terminal 53 of the first comparator 49 and the input terminal 59 of the second comparator 61 and a capacitor 57 connected between terminal 59 and ground The values of capacitor 57, resistor 55 and the reference voltage applied to the inverting input terminal 63 of comparator 61 are chosen such that the detecting circuit requires positive pulses to have a predetermined duration of at least 75 nanoseconds to detect a valid positive signal of the preamble. The predetermined duration required by the integrating circuit, however, can be set to other values depending on the data encoding and maximum bit cell time intervals of the alternating bit sequence of the preamble.

As with the negative pulse detecting circuit, a diode 69 having its anode connected to the input terminal 59 of comparator 61 and its cathode connected to output terminal 53 of comparator 49 provides rapid discharge of capacitor 57 to reset the integrating circuit when the signal applied to input terminal 47 falls below the threshold voltage applied to input terminal 51. Similarly, a resistor 67 has its terminals connected to the input terminal 59 of comparator 61 and a positive voltage 88 to maintain a forward bias current across diode 69 and provide a known reset voltage at input terminal 59. When the signal applied to input terminal 59 rises above the threshold voltage applied to input terminal 63 for the predetermined time, an output signal appears at line 65 corresponding to a positive pulse characteristic of a high voltage level of the preamble bit sequence.

Another feature of the squelch circuit is provided by detecting the absence of pulse activity of either positive or negative value since it is desirable to reset the squelch circuit 10 if the received signal activity discontinues. The output terminal 52 of comparator 48 corresponding to a negative pulse exceeding a threshold value is logically NORed with the output terminal 53 of comparator 49 corresponding to a positive pulse exceeding a threshold value. The output signal at a line 70 of the logical NOR is applied to an integrating circuit that functions the same as the integrating circuits for the positive and negative pulses. The values of resistor 72, capacitor 74 and the threshold voltage appearing at the inverting input terminal 80 of comparator 78 are chosen so that the absence of positive or negative signals exceeding a reset duration, preferably 150 nanoseconds, creates a high voltage signal at the output 82 of comparator 78. A diode 84 and a resistor 86 provide a rapid reset to the voltage level appearing at terminal 76 when the output signal at line 70 is a low voltage.

Still another feature of the squelch circuit provides for detection of positive and negative pulses of a longer duration than a positive or negative pulse characteristic of the preamble. It has been found that a pulse exceeding a long duration, for example 200 nanoseconds, indicates that the squelch circuit 10 has received invalid data. A detection of exceedingly long positive or negative pulses likewise resets the squelch circuit 10. To obtain this information, the output signal from comparator 48 at line 52 is applied to an integrating circuit that functions the same as the integrating circuits mentioned above. The values of resistor 90, capacitor 92 and the threshold voltage applied at the inverting input terminal 96 of comparator 98 are chosen so that a negative pulse having a duration exceeding 200 nanoseconds provides a high level output at line 100. A diode 104 has its anode connected to the noninverting input terminal 94 of comparator 98 and its cathode connected to output terminal 52 along with resistor 102 provide rapid reset of the voltage applied to input terminal 94 when a low level voltage appears at terminal 52. A high level signal at line 100 provides a reset signal for the squelch circuit 10.

Likewise, the output signal at line 53 is applied to an integrating circuit that provides a high level output at line 116 for positive pulses exceeding 200 nanoseconds. The values of resistor 106, capacitor 108 and the threshold voltage appearing at the inverting input terminal 112 of comparator 114 determine the duration for providing a high level output at line 116. A high level signal at line 116 resets the squelch circuit 10. A diode 120 and resistor 118 reset the voltage level at the noninverting input terminal 110 when a low level voltage appears at terminal 53.

By way of example and not by way of limitation, the circuit components of the integrating circuits for the analog portion of squelch circuit 10 may have values as follows for the noted time intervals:

| Reference Numeral | Value | Integrating Duration (nanoseconds) |
|---|---|---|
| 54, 55, 72, 90, 106 | 1000 ohms | |
| 66, 67, 86, 102, 118 | 10,000 ohms | |
| 56 | 47 picofarads | 25 |
| 57 | 220 picofarads | 75 |
| 74 | 470 picofarads | 150 |
| 92, 108 | 560 picofarads | 200 |

The threshold voltage present at inverting terminals 62, 63, 80, 96 and 112 is approximately two volts for the above values.

Figure 5:
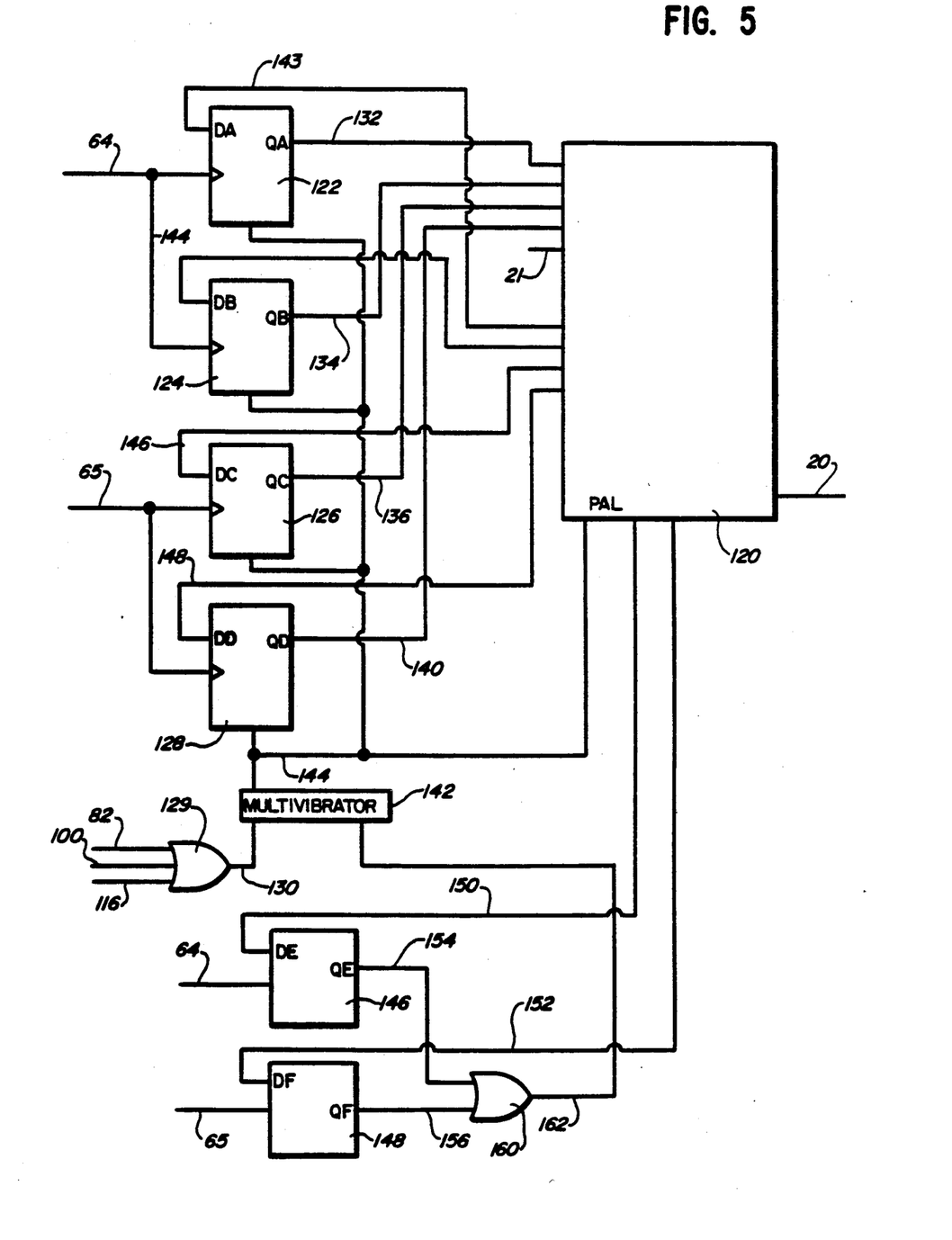
FIG. 5 is a schematic diagram of the sequential portion of the squelch circuit of the present invention specified by the state diagram of FIG. 3.

As best seen in FIG. 5, the signals generated by the analog portion of the circuitry are applied to a sequential circuit. The output signal 64 corresponding to the detection of a valid negative pulse is applied to the clock inputs of a first pair of D flip-flops 122 and 124. Similarly, signal 65 corresponding to a valid positive pulse is applied to the clock inputs of a second pair of D flip-flops 126 and 128. The outputs QA, QB, QC and QD of flip-flops 122, 124, 126 and 128 respectively are thereafter applied as inputs to a programmable array logic (PAL) 120. The PAL also receives the transmit active signal XB at line 21 from transceiver 14 for the condition when transceiver 14 concurrently is sending data.

The PAL 120 applies inputs to flip-flops 122, 124, 126 and 128 on lines 143, 144, 146, and 148 respectively, and is programmed according to the following state equations where "+" denotes a logical OR, adjacent symbols denote a logical AND and a "'" denotes a logical NOT:

$$DA = QA'\ QB'\ QC\ QD' + QA\ QB'\ QC\ QD + QA\ QB\ QC\ QD$$

$$DB = QA\ QB'\ QC\ QD + QA\ QB\ QC\ QD' + QA\ QB\ QC\ QD\ + QA'\ QB\ QC\ QD$$

$$DC = XB'\ QA\ QB\ QC'\ QD + XB\ QA\ QB\ QC\ QD + QA\ QB\ QC\ QD + QA'\ QB\ QC\ QD' + QA'\ QB\ QC\ QD$$

$$DD = QA\ QB'\ QC\ QD' + XB'\ QA\ QB\ QC\ QD + QA\ QB\ QC\ QD + QA'\ QB\ QC\ QD' + QA'\ QB\ QC\ QD$$

An unsquelch signal or an output enable signal is also generated by the PAL 120 at a line 20 according to the following state equation:

$$\text{Unsquelch} = QA\ QB\ QC\ QD + QA'\ QB\ QC\ QD$$

Otherwise, a squelch signal or an output disable signal is present at line 20. It will be understood to those skilled in the art which this invention pertains that the logic functions performed by PAL 120 could just as easily be performed and implemented with other logical circuitry The PAL 120 receives reset information indicative of detection of both idle positive or negative pulses, the detection of positive or negative pulses of too long a duration, or the detection of two sequential valid positive pulses or the sequential detection of two valid negative pulses. An OR gate 129 receives the signal at line 82 from FIG. 3 corresponding to detection of an idle pulse, the signal at line 100 corresponding to detection of a negative pulse greater than 200 nanoseconds, and the signal at line 116 corresponding to detection of a positive pulse greater than 200 nanoseconds. The OR gate 129 applies the resulting signal on a line 130 to an input of a monostable multivibrator 142 that provides a reset pulse on a line 144 to the PAL 120 and flip-flops 122, 124, 126, and 128 for reset of the sequential circuitry The PAL 120 also applies reset information corresponding to the detection of either two consecutive positive or two consecutive negative pulses to D flip-flops 146 and 148, which receive clock inputs from signals on lines 64 and 65 corresponding to valid negative and positive pulses. The PAL 120 applies signals to inputs of flip-flops 146 and 148 on lines 150 and 152 according to the following state equations:

$$DE = QA\ QB'\ QC\ QD' + QA\ QB\ QC\ QD + QA'\ QB\ QC\ QD'$$

$$DF = QA\ QB'\ QC\ QD + QA\ QB\ QC\ QD'$$

An OR gate 160 receives a signal on line 154 corresponding to the detection of consecutive negative pulses and a signal on line 156 corresponding to the detection of consecutive positive pulses The OR gate 160 applies the resulting signal on a line 162 to another input of monostable multivibrator 142. Multivibrator 142 thereafter provides a reset pulse on line 144 to the PAL 120 and flip-flops 122, 124, 126, and 128 to reset the sequential circuitry. Of course, as is well known, other forms of reset circuits can be used in place of or in conjunction with OR gate 129.

Figure 3:
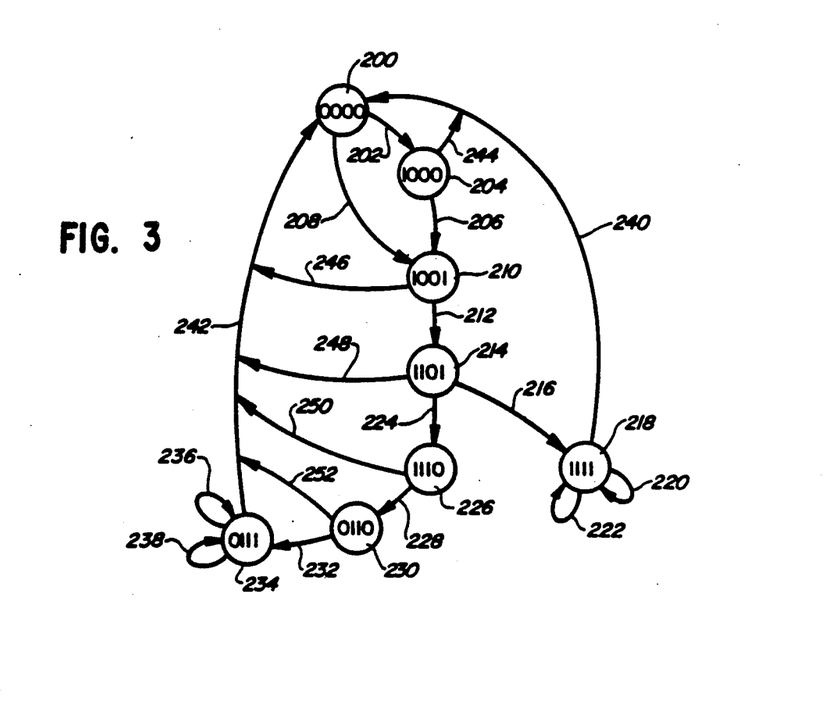
FIG. 3 is a state diagram representation of the sequence required by the squelch circuit of the present invention to unsquelch the transceiving unit of FIG. 1.

Referring now to FIG. 3, therein is shown a state diagram for the generation of the logical circuitry shown in FIG. 5 that provides the required sequence of positive and negative pulses in order to generate the unsquelch or output enable signal at line 20. The numerals within the nodes shown in FIG. 3 correspond to the outputs QA, QB, QC and QD of flip-flops 122, 124, 126 and 128 at the various states The node shown as numeral 200 represents the initial state of the squelch detecting circuit. The transition denoted by arrow 202 represents the detection of a valid negative pulse of a predetermined duration of at least 25 nanoseconds to the next state represented by node 204. Arrow 206 represents the transition upon the sequential detection of a valid positive pulse to the state at node 210. Due to noise on the network, the first valid pulse detected by the squelch circuit may alternatively be a positive pulse represented by the transition 208 to the state at node 210. The transition shown as arrow 212 represents the detection of a valid negative pulse to the next state shown as node 214. If the MAU unit is not transmitting data, transition arrow 216 represents the detection of a positive pulse that is logically ANDed with the complement of the transmit active status signal. This sequence provides an unsquelch signal for the unit at node 218 which corresponds to the signal on line 20. Thus, squelch circuit 10 requires the detection of the sequence of a valid negative pulse, a valid positive pulse, a valid negative pulse and a valid positive pulse or the detection of the sequence of a valid positive pulse, a valid negative pulse, and a valid positive pulse to unsquelch or enable the system. Subsequent transitions of positive pulses 220 and negative pulses 222 do not effect the squelch circuit 10 once enabled.

The detection of idle of both positive and negative value, however, will reset the squelch circuit 10 to the initial state 200 via an arrow 240. Further, any pulse recognition not in conformance with the predetermined sequence of pulses characteristic of the preamble does not unsquelch the receiving portion. For example, the detection of a positive pulse followed by a positive pulse or the detection of a negative pulse followed by a negative pulse resets the squelch circuit 10. The detection of a consecutive negative pulse at node 204, the detection of a consecutive positive pulse at node 210, or the detection of a consecutive negative pulse at node 214 will reset squelch circuit 10 to the initial state 200 via arrows 244, 246 and 248 respectively. Likewise, the detection of a positive or negative pulse having an invalid duration resets squelch circuit 10.

If the unit is transmitting data, the detection of a positive pulse that is logically ANDed with the transmit data signal is represented by the transition arrow 224 to the next state at node 226. In this condition, the squelch circuit requires the sequential detection of a negative pulse at transition 228 to the next state 230 and the detection of a positive pulse at transition 232 to node 234. This longer sequence of positive and negative pulses provides an unsquelch signal at node 234. Subsequent positive and negative pulses 236 and 238 do not effect the detecting sequence. The detection of idle of both positive and negative value, however, will reset the squelch circuit 10 to the initial state 200 via an arrow 242. Likewise, the detection of a consecutive positive pulse at node 226 or the detection of a consecutive negative pulse at node 230 will reset squelch circuit 10 via arrows 250 and 252. The system requires an extended sequence when the transceiver 14 is transmitting to verify that a valid data stream is present and not a noise burst which will result in a collision contention process on the network.

A novel squelch circuit has therefore been described. The circuit detects a sequence of positive and negative pulses quantified in time based on prior knowledge of the sequence of a valid packet of data. The circuit operates within a relatively short time and is quite reliable. Of course, the invention is not limited to the particular embodiments described herein since other embodiments of the principles of this invention will occur to those skilled in the art, and familiar with the teachings of this application, to which this invention pertains, particularly upon considering the foregoing teachings. The implementations of the analog functions and the logical functions discussed herein are given solely by way of non-limiting example. It will also be understood by those skilled in the art that the timing sequences invention may be scaled up or scaled down to conform with other start up preamble sequences based on other encoding schemes.

What is claimed is:

1. A squelch circuit for receiving the transmission of data over a data transmission line and detecting a predetermined sequence of positive and negative pulses indicative of a preamble of a data stream, the circuit comprising:

first sensing means for receiving said transmission and detecting the presence of positive pulses of at least a predetermined positive threshold voltage level and continuing for at least a first predetermined duration, and providing a first output signal;

second sensing means for receiving said transmission and detecting the presence of negative pulses of at least a predetermined negative threshold voltage level and continuing for at least a second predetermined duration, and providing a second output signal;

indication means responsive to said first and second output signals for detecting said predetermined sequence of positive and negative pulses indicative of said preamble and providing an enable signal; and logic means for receiving said transmission and responsive to said enable signal for passing said transmission.

2. The squelch circuit of claim 1, wherein said data transmission line is twisted pair media.

3. A squelch circuit for receiving the transmission of data over a twisted pair media and detecting a predetermined sequence of positive and negative pulses indicative of a preamble of a data stream, the circuit comprising:

first sensing means for receiving said transmission and detecting the presence of positive pulses of at least a predetermined positive threshold voltage level and continuing for at least a first predetermined duration, and providing a first output signal;

second sensing means for receiving said transmission and detecting the presence of negative pulses of at least a predetermined negative threshold voltage level and continuing for at least a second predetermined duration, and providing a second output signal;

indication means responsive to said first and second output signals for detecting said predetermined sequence of positive and negative pulses indicative of said preamble and providing an enable signal;

said indication means preventing the generation of said enable signal when said first output signal comprises consecutive positive pulses or when said second output signal comprises consecutive negative pulses;

logic means for receiving said transmission and responsive to said enable signal from said indication means for passing said transmission;

third sensing means connected to said first and second sensing means for detecting the absence of both positive pulses of at least a predetermined positive threshold voltage level and negative pulses of at least a predetermined negative threshold voltage level for a third predetermined duration, and providing a reset signal indicative of the absence of said predetermined sequence to said indication means to prevent the generation of said enable signal;

fourth sensing means connected to said first sensing means for detecting positive pulses of at least a predetermined positive threshold voltage level and continuing for a fourth predetermined duration, and providing a reset signal indicative of the absence of said predetermined sequence to said indication means to prevent the generation of said enable signal; and fifth sensing means connected to said second sensing means for detecting negative pulses of at least a predetermined negative threshold voltage level and continuing for a fifth predetermined duration, and providing a reset signal indicative of the absence of said predetermined sequence to said indication means to prevent the generation of said enable signal.

4. A method of distinguishing between a data stream and noise transmitted over a data transmission line in a network and for passing said data stream and inhibiting said noise, said data stream having a preamble with a predetermined sequence of positive and negative pulses, comprising the steps of:

receiving said transmission over said data transmission line;

detecting when positive pulses of at least a predetermined positive threshold voltage level are present and continuing for at least a first predetermined duration;

providing a first output signal when said positive pulses are detected;

detecting when negative pulses of at least a predetermined negative threshold voltage level are present and continuing for at least a second predetermined duration;

providing a second output signal when said negative pulses are detected;

providing an enable signal when said first and second output signals are present in the same sequence as said predetermined sequence of positive and negative pulses indicative of the presence of said data stream preamble; and passing said received transmission when said enable signal is present.

5. A method for distinguishing between a data stream and noise transmitted over a data transmission line in a network and for passing said data stream and inhibiting the passage of said noise, said data stream having a preamble with a predetermined sequence of positive and negative pulses, comprising the steps of:

receiving said transmission over said balanced line;

detecting the presence of positive pulses of at least a predetermined positive threshold voltage level and continuing for at least a first predetermined duration;

providing a first output signal indicative of the presence of said positive pulses;

detecting the presence of negative pulses of at least a predetermined negative threshold voltage level and continuing for at least a second predetermined duration;

providing a second output signal indicative of the presence of said negative pulses;

determining the presence of said first and second output signals and providing an enable signal indicative of the presence of said data stream preamble to pass said received transmission;

detecting the absence of both said positive pulses of at least a predetermined positive threshold voltage level and said negative pulses of at least a predetermined negative threshold voltage level for a third predetermined duration, and providing a disable signal indicative of the absence of said data stream preamble to inhibit the passage, of said received transmission;

detecting positive pulses of at least a predetermined positive threshold voltage level and continuing for a fourth predetermined duration, and providing said disable signal indicative of the absence of said data stream preamble to inhibit the passage of said received transmission;

detecting negative pulses of at least a predetermined negative threshold voltage level and continuing for a fifth predetermined duration, and providing said disable signal indicative of the absence of said data stream preamble to inhibit the passage of said received transmission; and detecting said first output signal comprising consecutive positive pulses or said second output signal comprising consecutive negative pulses and providing said disable signal indicative of the absence of said data stream preamble to inhibit passage of said received transmission.

6. A squelch circuit for distinguishing between noise and a data stream in a transmission in a data processing network over twisted pair media, said data stream having a predetermined sequence of positive and negative pulses, comprising:

means for receiving said transmission and generating a series of positive and negative pulses;

first amplitude detection means for recognizing negative pulses of at least a first predetermined negative threshold voltage level and providing a first intermediate output signal;

second amplitude detection means for recognizing positive pulses of at least a predetermined positive threshold voltage level and providing a second intermediate output signal;

first duration detecting means for receiving said first intermediate output signal and detecting the continuance of said first intermediate output signal for a first predetermined duration, and providing a first output signal;

second duration detecting means for receiving said second intermediate output signal and detecting the continuance of said second intermediate output signal for a second predetermined duration, and providing a second output signal; and indication means responsive to said first and second output signals for detecting said predetermined sequence of positive and negative pulses and providing an enable signal to pass said received transmission.

7. The squelch circuit of claim 6 further comprising means responsive to said first and second intermediate output signals for recognizing an absence of both said positive and said negative pulses for a third predetermined duration, and providing a disable signal to said indication means to inhibit the passage of said received transmission.

8. The squelch circuit of claim 7 further comprising means responsive to said first intermediate output signal for recognizing negative pulses continuing for a fourth predetermined duration and providing a disable signal to said indication means to inhibit the passage of said received transmission.

9. The squelch circuit of claim 8 further comprising means responsive to said second intermediate output signal for recognizing positive pulses continuing for a fifth predetermined duration and providing a disable signal to said indication means to inhibit the passage of said received transmission.

10. The squelch circuit of claim 9 wherein said indication means inhibits the passage of said received transmission if said first output signal comprises consecutive positive pulses or if said second output signal comprises consecutive negative pulses.

11. The squelch circuit of claim of claim 6 further comprising means responsive to said first intermediate output signal for recognizing negative pulses of a third predetermined duration and providing a disable signal to said indication means to inhibit the passage of said received transmission.

12. The squelch circuit of claim 11 further comprising means responsive to said second intermediate output signal for recognizing positive pulses of a fourth selected duration and providing a disable signal to said indication means to inhibit the passage of said received transmission.

13. The squelch circuit of claim 12 wherein said indication means inhibits the passage of said received transmission if said first output signal comprises consecutive positive pulses or if said second output signal comprises consecutive negative pulses.

14. The squelch circuit of claim 16 further comprising means responsive to said second intermediate output signal for recognizing positive pulses of a third selected duration and providing a disable signal to said indication means to inhibit the passage of said received transmission.

15. The squelch circuit of claim 14 wherein said indication means inhibits the passage of said received transmission if said first output signal comprises consecutive positive pulses or if said second output signal comprises consecutive negative pulses.

16. The squelch circuit of claim 6 wherein said indication means inhibits the passage of said received transmission if said first output signal comprises consecutive positive pulses or if said second output signal comprises consecutive negative pulses.

17. The squelch circuit of claim 6 wherein said squelch circuit is located at one node of a plurality of nodes in said network and further comprises:
means for generating a transmit signal indicative of the concurrent transmission by said one node and at least one other node of said network;
said indication means responsive to said transmit signal for altering the duration of said predetermined sequence of positive and negative pulses.

18. A squelch circuit located at one node of a plurality of nodes in a data processing network for distinguishing between noise and a data stream in a transmission in said data processing network over twisted pair media, said data stream having a predetermined sequence of positive and negative pulses, comprising:
means for receiving said transmission and generating a series of positive and negative pulses;
first amplitude detection means for recognizing negative pulses of at least a first predetermined negative threshold voltage level and providing a first intermediate output signal;
second amplitude detection means for recognizing positive pulses of at least a predetermined positive threshold voltage level and providing a second intermediate output signal;
first duration detecting means for receiving said first intermediate output signal and detecting the continuance of said first intermediate output signal for a first predetermined duration, and providing a first output signal;
second duration detecting means for receiving said second intermediate output signal for a second predetermined duration, and providing a second output signal;
indication means responsive to said first and second output signals for detecting said predetermined sequence of positive and negative pulses and providing an enable signal to pass said received transmission;
said indication means inhibiting the passage of said received transmission when said first output signal comprises consecutive positive pulses or said second output signal comprises consecutive negative pulses;
means responsive to said first and second output signals for recognizing the absence of both said positive and negative pulses for a third predetermined duration, and providing a disable signal to said indication means to inhibit the passage of said received transmission;
means responsive to said first intermediate output signal for recognizing negative pulses continuing for a fourth predetermined duration and providing a disable signal to said indication means to inhibit said passage of said received transmission;
means responsive to said second intermediate output signal for recognizing negative pulses continuing for a fifth predetermined duration and providing a disable signal to said indication means to inhibit said passage of said received transmission; and
means for generating a transmit signal indicative of the concurrent transmissions by said one node and at least one other node of said network;
said indication means responsive to said transmit signal for altering the duration of said predetermined sequence of positive and negative pulses.

19. A squelch circuit for receiving the transmission of data over a data transmission line and detecting a predetermined sequence of positive and negative pulses indicative of a preamble of a data stream, the circuit comprising:
first sensing means for receiving said transmission and detecting the presence of positive pulses of at least a predetermined positive threshold voltage level and continuing for at least a first predetermined duration, and providing a first output signal;
second sensing means for receiving said transmission and detecting the presence of negative pulses of at least a predetermined negative threshold voltage level and continuing for at least a second predetermined duration, and providing a second output signal;
indication means responsive to said first and second output signals for detecting said predetermined sequence of positive and negative pulses indicative of said preamble and providing an enable signal;
third sensing means connected to said first and second sensing means for detecting the absence of both positive pulses of at least a predetermined positive threshold voltage level and negative pulses of at least a predetermined negative threshold voltage level for a third predetermined duration, and providing a reset signal output to said indication means to prevent the generation of said enable signal; and
logic means for receiving said transmission and responsive to said enable signal for passing said transmission.

20. The squelch circuit of claim 19 further comprising fourth sensing means connected to said first sensing means for detecting positive pulses of at least a predetermined positive threshold voltage level and continuing for a fourth predetermined duration, and providing a reset signal output to said indication means to prevent the generation of said enable signal.

21. The squelch circuit of claim 20 further comprising fifth sensing means connected to said second sensing means for detecting negative pulses of at least a predetermined negative threshold voltage level and continuing for a fifth predetermined duration, and providing a reset signal output of said indication means to prevent the generation of said enable signal.

22. The squelch circuit of claim 21 wherein said indication means prevents the generation of said enable signal when said first output signal comprises consecutive positive pulses or when said second output signal comprises consecutive negative pulses.

23. A squelch circuit for receiving the transmission of data over a data transmission line and detecting a predetermined sequence of positive and negative pulses indicative of a preamble of a data stream, the circuit comprising:
   first sensing means for receiving said transmission and detecting the presence of positive pulses of at least a predetermined positive threshold voltage level and continuing for at least a first predetermined duration, and providing a first output signal;
   second sensing means for receiving said transmission and detecting the presence of negative pulses of at least a predetermined negative threshold voltage level and continuing for at least a second predetermined duration, and providing a second output signal;
   indication means responsive to said first and second output signals for detecting said predetermined sequence of positive and negative pulses indicative of said preamble and providing an enable signal;
   third sensing means connected to said first sensing means for detecting positive pulses of at least a predetermined positive threshold voltage level and continuing for a third predetermined duration, and providing a reset signal output to said indication means to prevent the generation of said enable signal; and
   logic means for receiving said transmission and responsive to said enable signal for passing said transmission.

24. The squelch circuit of claim 23 further comprising fourth sensing means connected to said second sensing means for detecting negative pulses of at least a predetermined negative threshold voltage level and continuing for a fourth predetermined duration, and providing a reset signal output to said indication means to prevent the generation of said enable signal.

25. The squelch circuit of claim 24 wherein said indication means prevent the generation of said enable signal if said first output signal comprises consecutive positive pulses or if said second output signal comprises consecutive negative pulses.

26. A squelch circuit for receiving the transmission of data over a data transmission line and detecting a predetermined sequence of positive and negative pulses indicative of a preamble of a data stream, the circuit comprising:
   first sensing means for receiving said transmission and detecting the presence of positive pulses of at least a predetermined positive threshold voltage level and continuing for at least a first predetermined duration, and providing a first output signal;
   second sensing means for receiving said transmission and detecting the presence of negative pulses of at least a predetermined negative threshold voltage level and continuing for at least a second predetermined duration, and providing a second output signal;
   indication means responsive to said first and second output signals for detecting said predetermined sequence of positive and negative pulses indicative of said preamble and providing an enable signal;
   third sensing means connected to said second sensing means for detecting negative pulses of at least a predetermined negative threshold voltage level and continuing for a third predetermined duration, and providing a reset signal output to said indication means to prevent the generation of said enable signal; and
   logic means for receiving said transmission and responsive to said enable signal for passing said transmission.

27. The squelch circuit of claim 26 wherein said indication means prevents the generation of said enable signal when said first output signal comprises consecutive positive pulses or when said second output signal comprises consecutive negative pulses.

28. A squelch circuit for receiving the transmission of data over a data transmission line and detecting a predetermined sequence of positive and negative pulses indicative of a preamble of a data stream, the circuit comprising:
   first sensing means for receiving said transmission and detecting the presence of positive pulses of at least a predetermined positive threshold voltage level and continuing for at least a first predetermined duration, and providing a first output signal;
   second sensing means for receiving said transmission and detecting the presence of negative pulses of at least a predetermined negative threshold voltage level and continuing for at least a second predetermined duration, and providing a second output signal;
   indication means responsive to said first and second output signals for detecting said predetermined sequence of positive and negative pulses indicative of said preamble and providing an enable signal, said indication means preventing the generation of said enable signal when said first output signal comprises consecutive positive pulses or when said second output signal comprises consecutive negative pulses; and
   logic means for receiving said transmission and responsive to said enable signal for passing said transmission.

29. A squelch circuit located at one node of a plurality of nodes in a data transmission network, for receiving the transmission of data over a data transmission line in said network and detecting a predetermined sequence of positive and negative pulses indicative of a preamble of a data stream, the circuit comprising:
   first sensing means for receiving said transmission and detecting the presence of positive pulses of at least a predetermined positive threshold voltage level and continuing for at least a first predetermined duration, and providing a first output signal;

second sensing means for receiving said transmission and detecting the presence of negative pulses of at least a predetermined negative threshold voltage level and continuing for at least a second predetermined duration, and providing a second output signal;

means for generating a transmit signal indicative of the concurrent transmission by said one node and at least one other node of said network;

indication means responsive to said first and second output signals for detecting said predetermined sequence of positive and negative pulses indicative of said preamble, said indication means further responsive to said transmit signal for altering the duration of said predetermined sequence of positive and negative pulse and providing an enable signal; and logic means for receiving said transmission and responsive to said enable signal for passing said transmission.

30. A method for distinguishing between a data stream and noise transmitted over a data transmission line in a network and for passing said data stream and inhibiting said noise, said data stream having a preamble with a predetermined sequence of positive and negative pulses, comprising the steps of:

receiving said transmission over said data transmission line;

detecting when positive pulses of at least a predetermined positive threshold voltage level are present and continuing for at least a first predetermined duration;

providing a first output signal when said positive pulses are detected;

detecting when negative pulses of at least a predetermined negative threshold voltage level are present and continuing for at least a second predetermined duration;

providing a second output signal when said negative pulses are detected;

providing an enable signal when said first and second output signals are present in the same sequence as said predetermined sequence of positive and negative pulses indicative of the presence of said data stream preamble;

providing a disable signal when both said positive pulses of at least a predetermined positive threshold voltage level and said negative pulses of at least a predetermined negative threshold voltage level are absent for a third predetermined duration;

passing said received transmission when said enable signal is present; and, inhibiting the passage of said received transmission when said disable signal is present.

31. The method of claim 30 further providing the steps of:

detecting when positive pulses of at least a predetermined positive threshold voltage level are present and continuing for a fourth predetermined duration, and providing a disable signal when said positive pulses continuing for a fourth duration are detected; and, inhibiting the passage of said received transmission when said disable signal is present.

32. The method of claim 21 further comprising the steps of:

detecting when negative pulses of at least a predetermined negative threshold voltage level are present and continuing for a fifth predetermined duration, and providing a disable signal when said negative pulses continuing for a fifth predetermined duration are detected; and, inhibiting the passage of said received transmission when said disable signal is present.

33. The method of claim 32 further comprising the steps of:

detecting when said first output signal comprising consecutive positive pulses is present, or when said second output signal comprising consecutive negative pulses is present and providing said disable signal when either said first output signal or said second output signal is detected; and inhibiting the passage of said received transmission when said disable signal is present.

34. A method for distinguishing between a data stream and noise transmitted over a data transmission line in a network and for passing said data stream and inhibiting said noise, said data stream having a preamble with a predetermined sequence of positive and negative pulses, comprising the steps of:

receiving said transmission over said data transmission line;

detecting when positive pulses of at least a predetermined positive threshold voltage level are present and continuing for at least a first predetermined duration;

providing a first output signal when said positive pulses are detected;

detecting when negative pulses of at least a predetermined negative threshold voltage level are present and continuing for at least a second predetermined duration;

providing a second output signal when said negative pulses are detected;

providing an enable signal when said first and second output signals are present in the same sequence as said predetermined sequence of positive and negative pulses indicative of the presence of said data stream preamble;

detecting when positive pulses of at least a predetermined positive threshold voltage level are present and continuing for a third predetermined duration, and providing a disable signal when said positive pulses continuing for a third duration are detected;

passing said received transmission when enable signal is present; and, inhibiting the passage of said received transmission when said disable signal is present.

35. The method of claim 34 further comprising the steps of:

detecting when negative pulses of at least a predetermined negative threshold voltage level are present and continuing for a fourth predetermined duration, and providing a disable signal when said negative pulses continuing for a fourth duration are detected; and, inhibiting the passage of said received transmission when said disable signal is present.

36. The method of claim 35 further comprising the steps of:

detecting when said first output signal comprising consecutive positive pulses is present, or when said second output signal comprising consecutive negative pulses is present and providing said disable signal when either said first output signal or said second output signal is detected; and inhibiting the passage of said received transmission when said disable signal is present.

37. A method for distinguishing between a data stream and noise transmitted over a data transmission line in a network and for passing said data stream and inhibiting said noise, said data stream having a preamble with a predetermined sequence of positive and negative pulses, comprising the steps of:
- receiving said transmission over said data transmission line;
- detecting when positive pulses of at least a predetermined positive threshold voltage level are present and continuing for at least a first predetermined duration;
- providing a first output signal when said positive pulses are detected;
- detecting when negative pulses of at least a predetermined negative threshold voltage level are present and continuing for at least a second predetermined duration;
- providing a second output signal when said negative pulses are detected;
- providing an enable signal when said first and second output signals are present in the same sequence as said predetermined sequence of positive and negative pulses indicative of the presence of said data stream preamble; and,
- detecting when negative pulses of at least a predetermined negative threshold voltage level are present and continuing for a third predetermined duration, and providing a disable signal when said negative pulses continuing for a third duration are detected;
- passing said received transmission when said enable signal is present; and,
- inhibiting the passage of said received transmission when said disable signal is present.

38. The method of claim 37 further comprising the steps of:
- detecting when said first output signal comprising consecutive positive pulses is present, or when said second output signal comprising consecutive negative pulses is present and providing said disable signal when either said first output signal or said second output signal comprising consecutive pulses is detected; and
- inhibiting the passage of said received transmission when said disable signal is present.

39. A method for distinguishing between a data stream and noise transmitted over a data transmission line in a network and for passing said data stream and inhibiting said noise, and data stream having a preamble with a predetermined sequence of positive and negative pulses, comprising the steps of:
- receiving said transmission over said data transmission line;
- detecting when positive pulses of at least a predetermined positive threshold voltage level are present and continuing for at least a first predetermined duration;
- providing a first output signal when said positive pulses are detected;
- detecting when negative pulses of at least a predetermined negative threshold voltage level are present and continuing for at least a second predetermined duration;
- providing a second output signal when said negative pulses are detected;
- providing an enable signal when said first and second output signals are present in the same sequence as said predetermined sequence of positive and negative pulses indicative of the presence of said data stream preamble;
- detecting when said first output signal comprising consecutive positive pulses is present, or said second output signal comprising consecutive negative pulses is present and providing a disable signal when either said first output signal or said second output signal comprising consecutive pulses is detected;
- passing said received transmission when said enable signal is present; and,
- inhibiting the passage of said received transmission when said disable signal is present.

40. A method for distinguishing between a data stream and noise transmitted over a data transmission line in a network and for passing said data stream and inhibiting said noise, said data stream having a preamble with a predetermined sequence of positive and negative pulses, comprising the steps of:
- receiving said transmission over said data transmission line;
- generating a transmit signal when concurrent transmission is received over said data transmission line;
- altering the duration of said predetermined sequence of positive and negative pulses when said transmit signal is present;
- detecting when positive pulses of at least a predetermined positive threshold voltage level are present and continuing for at least a first predetermined duration;
- providing a first output signal when said positive pulses are detected;
- detecting when negative pulses of at least a predetermined negative threshold voltage level are present and continuing for at least a second predetermined duration;
- providing a second output signal when said negative pulses are detected;
- providing an enable signal when said first and second output signals are present in the same sequence as said predetermined sequence of positive and negative pulses indicative of the presence of said data stream preamble; and
- passing said received transmission when said enable signal is present.

* * * * *